(12) United States Patent
Lee et al.

(10) Patent No.: US 8,085,379 B2
(45) Date of Patent: Dec. 27, 2011

(54) CIRCUIT BOARD AND DISPLAY DEVICE HAVING THE SAME

(75) Inventors: Sang-Hoon Lee, Seoul (KR); Keun-Woo Park, Gangnam-gu (KR); Pil-Mo Choi, Seoul (KR); Ung-Sik Kim, Suwon-si (KR); Kook-Chul Moon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 946 days.

(21) Appl. No.: 11/392,446

(22) Filed: Mar. 29, 2006

(65) Prior Publication Data
US 2006/0220991 A1 Oct. 5, 2006

(30) Foreign Application Priority Data
Mar. 29, 2005 (KR) .................. 10-2005-0025943

(51) Int. Cl.
*G02F 1/1345* (2006.01)
(52) U.S. Cl. .................. 349/152; 349/149; 349/151
(58) Field of Classification Search .......... 349/149–152; 345/52
See application file for complete search history.

(56) References Cited

U.S. PATENT DOCUMENTS

| | | | | |
|---|---|---|---|---|
| 5,640,216 A * | 6/1997 | Hasegawa et al. | ............... | 349/58 |
| 6,924,794 B2 * | 8/2005 | Moon | ............................ | 345/204 |
| 2002/0167508 A1 * | 11/2002 | Ishiyama | ....................... | 345/205 |
| 2003/0063080 A1 * | 4/2003 | Takahashi et al. | ............. | 345/211 |
| 2003/0231275 A1 * | 12/2003 | Shirato et al. | .................. | 349/149 |
| 2004/0246427 A1 | 12/2004 | Iwanaga et al. | ............... | 349/149 |
| 2005/0157243 A1 * | 7/2005 | Hayata et al. | ................. | 349/149 |
| 2006/0092642 A1 * | 5/2006 | Nakata et al. | ................. | 362/294 |
| 2008/0273156 A1 * | 11/2008 | Hayashi et al. | ............... | 349/149 |

FOREIGN PATENT DOCUMENTS

| | | |
|---|---|---|
| CN | 1135423 | 3/2001 |
| CN | 1373386 A | 10/2002 |
| CN | 1495498 A | 5/2004 |
| CN | 1532597 A | 9/2004 |
| JP | 09-138387 A | 5/1997 |
| JP | 11126792 A | 5/1999 |
| JP | 2001133756 A | 5/2001 |
| JP | 2001-156418 | 6/2001 |
| JP | 2001-215892 | 8/2001 |
| JP | 2001-215893 | 8/2001 |
| JP | 2002-6337 | 1/2002 |
| JP | 2002023187 A | 1/2002 |
| JP | 2002091333 A | 3/2002 |
| JP | 2002116701 A | 4/2002 |
| JP | 2002-277891 | 9/2002 |
| JP | 2002366055 A | 12/2002 |
| JP | 2003-108021 | 4/2003 |
| JP | 2003-149669 | 5/2003 |
| JP | 2004055997 A | 2/2004 |
| JP | 2004061892 A | 2/2004 |
| JP | 2004252331 A | 9/2004 |
| KR | 10-0327921 | 2/2002 |
| KR | 2003-0026861 | 4/2003 |
| KR | 10-0402507 | 10/2003 |
| KR | 10-2004-0078463 | 9/2004 |

* cited by examiner

*Primary Examiner* — David Nelms
*Assistant Examiner* — Nathanael R Briggs
(74) *Attorney, Agent, or Firm* — Cantor Colburn LLP

(57) ABSTRACT

Provided are a circuit board and a display device having the circuit board. The circuit board includes a first surface opposite to a second surface and a first and a second wire disposed on the first surface. The circuit board is attached substantially to one side of the display panel unit.

12 Claims, 7 Drawing Sheets

CIRCUIT BOARD AND DISPLAY DEVICE HAVING THE SAME

This application claims priority to Korean Patent Application No. 2005-0025943, filed on Mar. 29, 2005, and all the benefits accruing therefrom under 35 U.S.C. §119, and the contents of which in its entirety are herein incorporated by reference.

BACKGROUND OF THE INVENTION (a) Field of the Invention

The present invention relates to a circuit board for a display device and a display device having the circuit board.

(b) Description of the Related Art

Generally, a liquid crystal display includes two panels having pixel electrodes and a common electrode, and a liquid crystal layer having dielectric anisotropy which is interposed therebetween. The pixel electrodes are arranged in a matrix, are connected to switching elements such as thin film transistors (TFT), and are supplied with data voltages line by line. The common electrode is formed on the entire surface of one display panel and is supplied with a common voltage. Each pixel electrode, the common electrode, and the liquid crystal layer therebetween constitute a liquid crystal capacitor from the view point of circuitry. The liquid crystal capacitor forms a basic unit of a pixel together with the switching element connected to the liquid crystal capacitor.

The liquid crystal display displays images by applying a voltage to the two electrodes to generate an electric field in the liquid crystal layer and adjusting the intensity of the electric field to control transmittance of light passing through the liquid crystal layer. In order to prevent deterioration resulting from application of a constant electric field to the liquid crystal layer over a long time, the polarity of the data voltages with respect to the common voltage is inverted in the unit of a frame, a line, or a dot, or the common voltage and the data voltages are all inverted.

Among such liquid crystal displays, a middle-sized or small-sized liquid crystal display used specifically in mobile phones includes a liquid crystal panel assembly, a flexible printed circuit board (FPC) having signal lines for supplying input signals from the outside, and an integration chip for controlling them.

The liquid crystal display includes a display panel having pixels including switching elements and display signal lines, a gate driver for supplying a gate-on voltage and a gate-off voltage to gate lines among the display signal lines to turn the switching elements of the pixels on or off, and a data driver for supplying data voltages to data lines among the display signal lines and applying the data voltages to the pixels through the turned-on switching elements. The integration chip includes the gate driver or the data driver, or both, and is generally mounted on the display panel in the form of COG (Chip On Glass).

The signal lines are connected to the integration chip, and the integration chip processes signals from the outside and supplies the signals to the liquid crystal panel assembly. The integration chip generates drive power for driving the gate driver and the data driver described above, and supplies the drive power to the gate driver and the data driver. A power supply chip constructed in the form of an integrated circuit to generate the source power is built into the integration chip. Passive elements such as capacitors and resistors are required for generating the source power. Such passive elements are often disposed on the FPC without being built into the integration chip in consideration of the sizes of the passive elements, and are connected to the power source chip through power supply lines.

In order to prevent the signal lines and the power supply lines connected to the passive elements from directly intersecting each other, the FPC has a two-layered structure of a top side and a bottom side. That is, one of the signal lines and the power supply lines is drawn through the FPC via holes at the intersections therebetween.

The FPC having the two-layered structure causes an increase in manufacturing cost. In addition, even when the lines intersect each other on the top side and the bottom side without directly intersecting each other at the same side, noise occurs in signals due to parasitic capacitance resulting from the intersections.

SUMMARY OF THE INVENTION

An exemplary embodiment of the present invention provides a circuit board having a single-layered structure and a display device having the circuit board.

Another exemplary embodiment of the present invention provides a circuit board for a display device having a display panel unit, he circuit board including a first surface opposite to a second surface and a first and a second wire disposed on the first surface. The circuit board is attached substantially to one side of the display panel unit is attached substantially to one side of the display panel unit.

Another exemplary embodiment of the present invention provides a display device including a display panel unit, a circuit board attached substantially to one side of the display panel unit, a first wire and a second wire disposed on one surface of the circuit board, and a drive circuit chip driving the display panel unit disposed on the display panel unit. A first wire and a second wire are connected to the driving circuit chip.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE INVENTION

Figure 1:
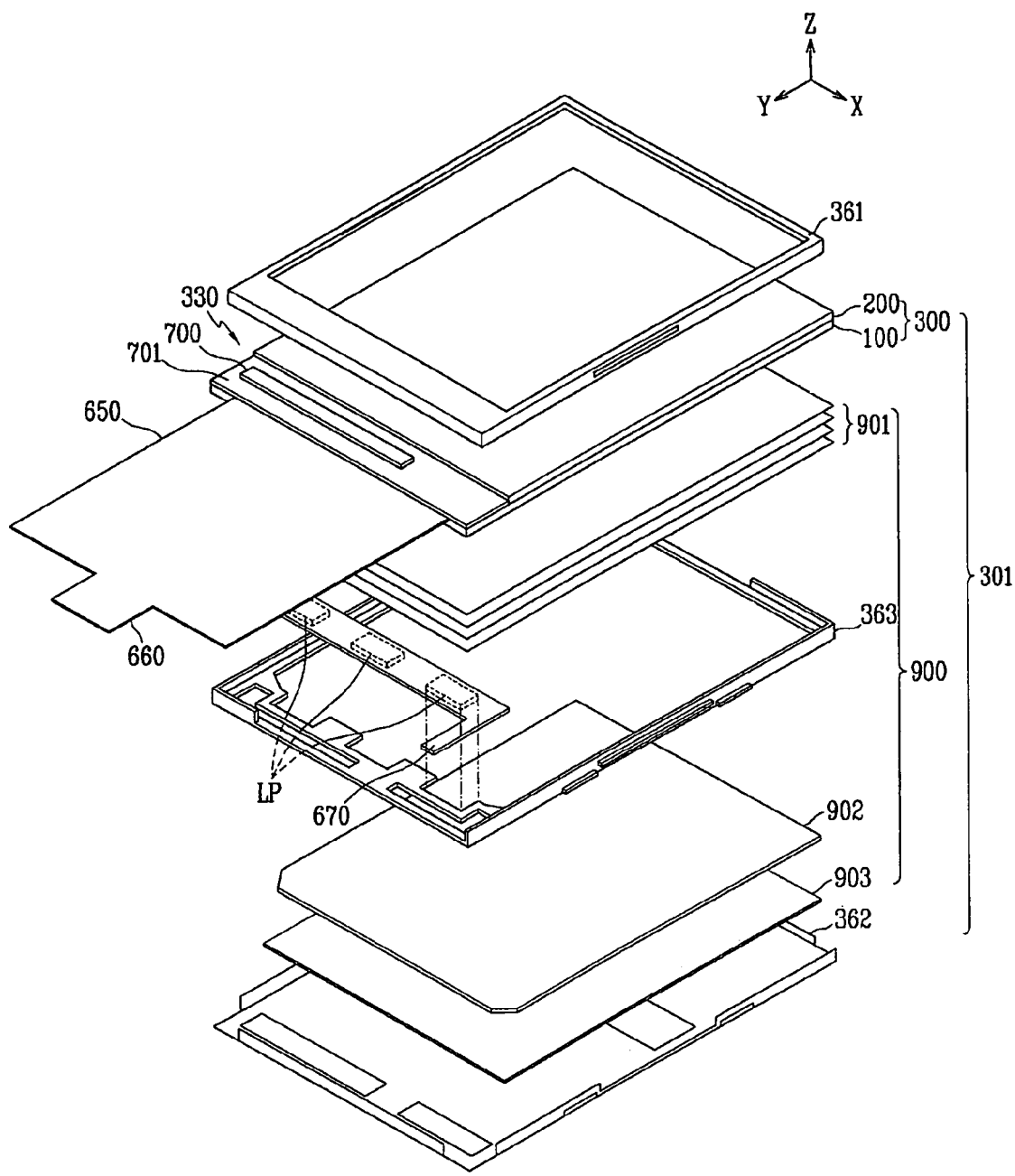
FIG. 1 is an exploded perspective view illustrating an exemplary embodiment of a liquid crystal display according to the present invention.

Hereinafter, exemplary embodiments of the present invention will be described in detail with reference to the attached drawings such that the present invention can be easily put into practice by those skilled in the art. However, the present invention is not limited to the exemplary embodiments, but may be embodied in various forms.

In the drawings, thicknesses are enlarged for the purpose of clearly illustrating layers and areas. In addition, like elements are denoted by like reference numerals in the whole specification.

It will be understood that when an element or layer is referred to as being "on", "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below", "above" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Liquid crystal displays according to the exemplary embodiments of the present invention will be now described in detail with reference to the accompanying drawings.

Figure 2:
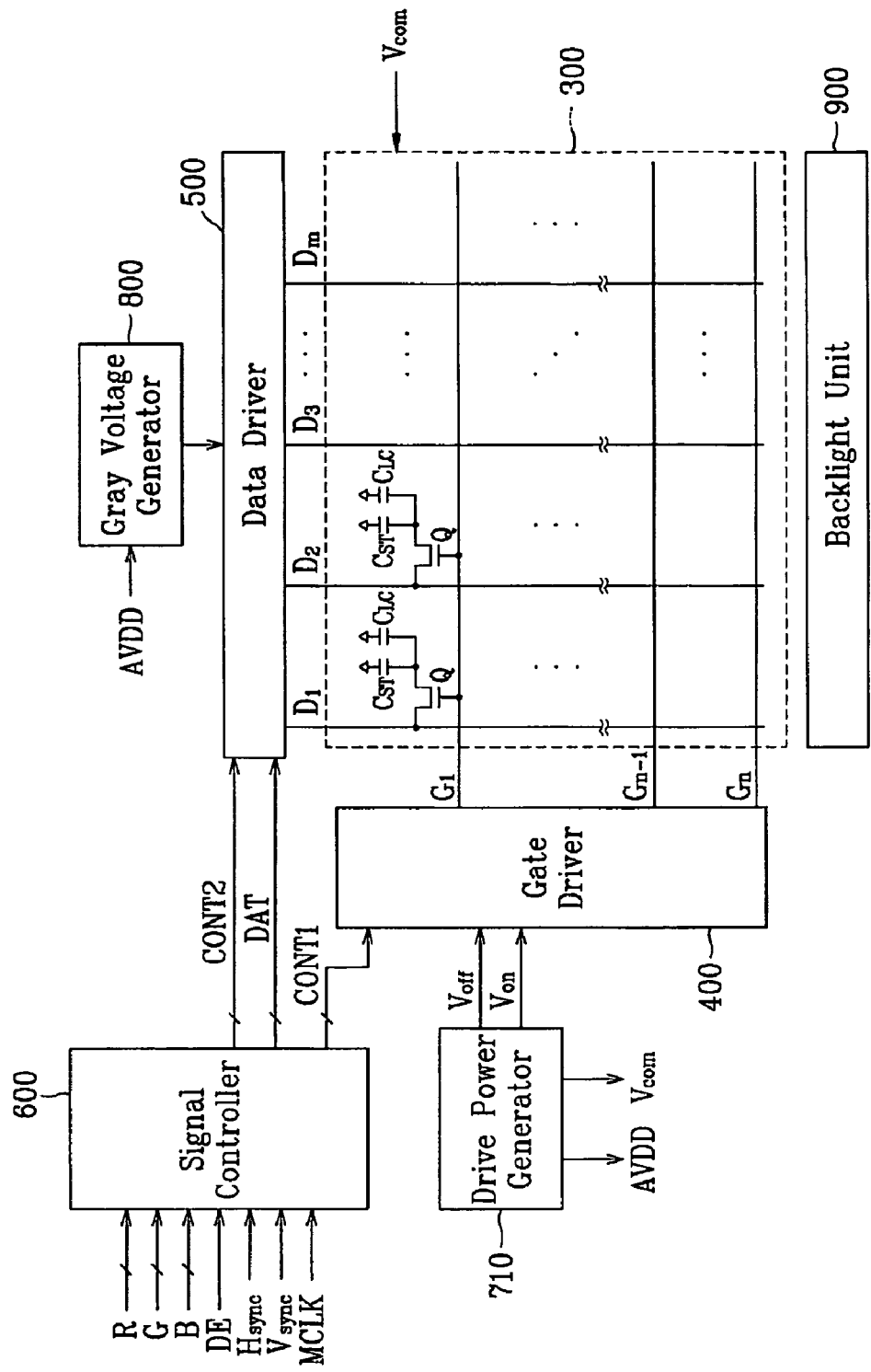
FIG. 2 is a block diagram illustrating an exemplary embodiment of a liquid crystal display according to the present invention.
Figure 3:
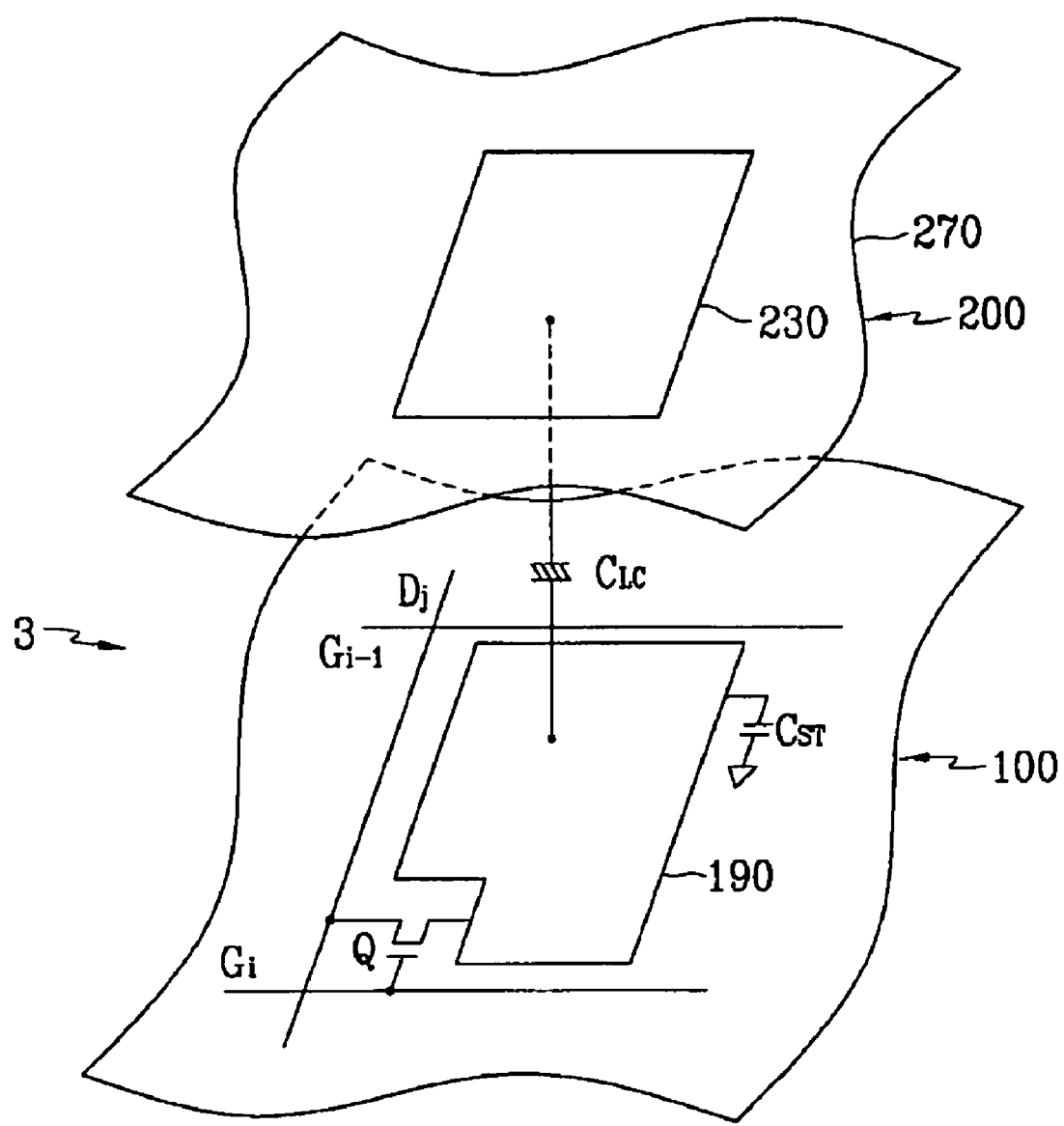
FIG. 3 is an equivalent circuit diagram of an exemplary embodiment of a pixel in a liquid crystal display according to the present invention.
Figure 4:
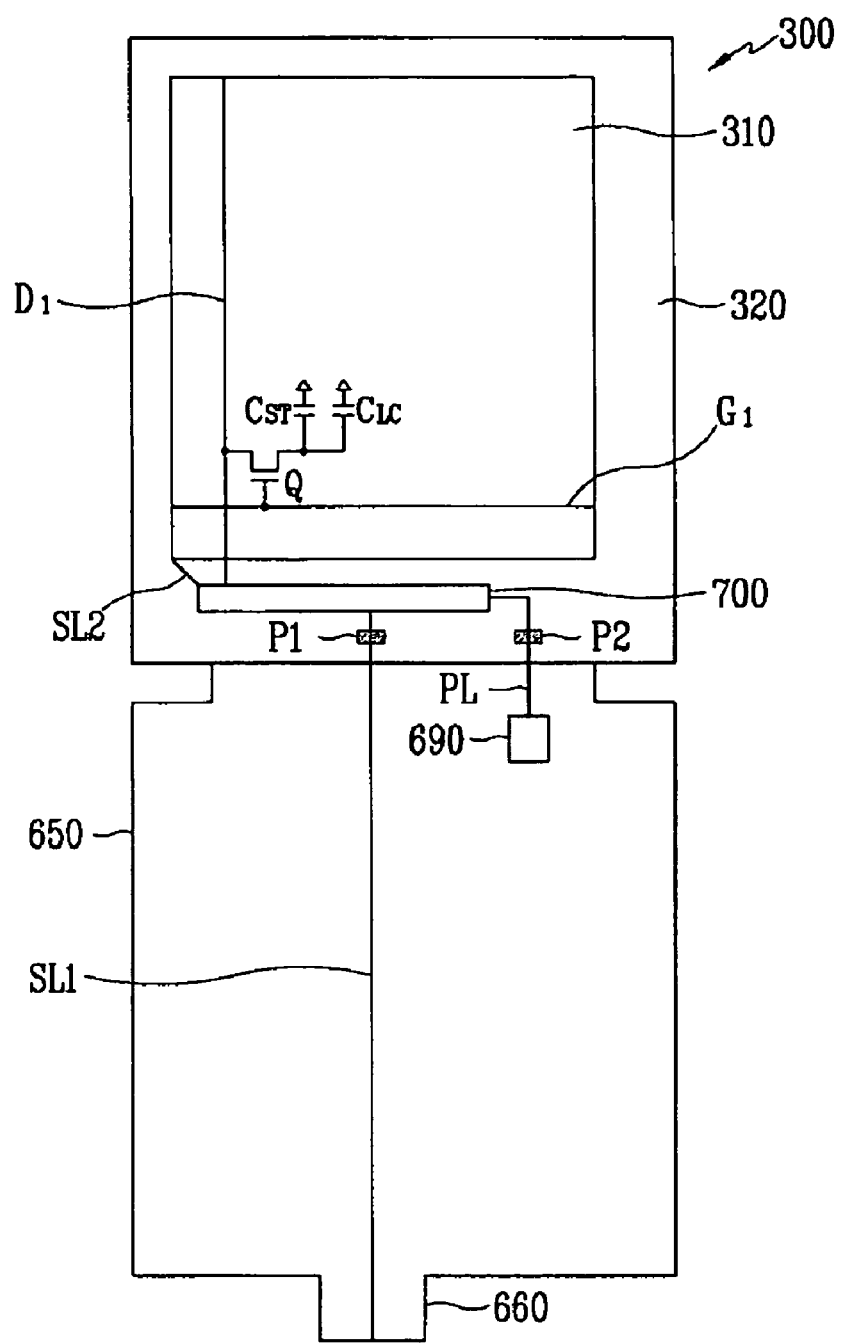
FIG. 4 is a schematic diagram illustrating an exemplary embodiment of a liquid crystal display according to the present invention.
Figure 5:
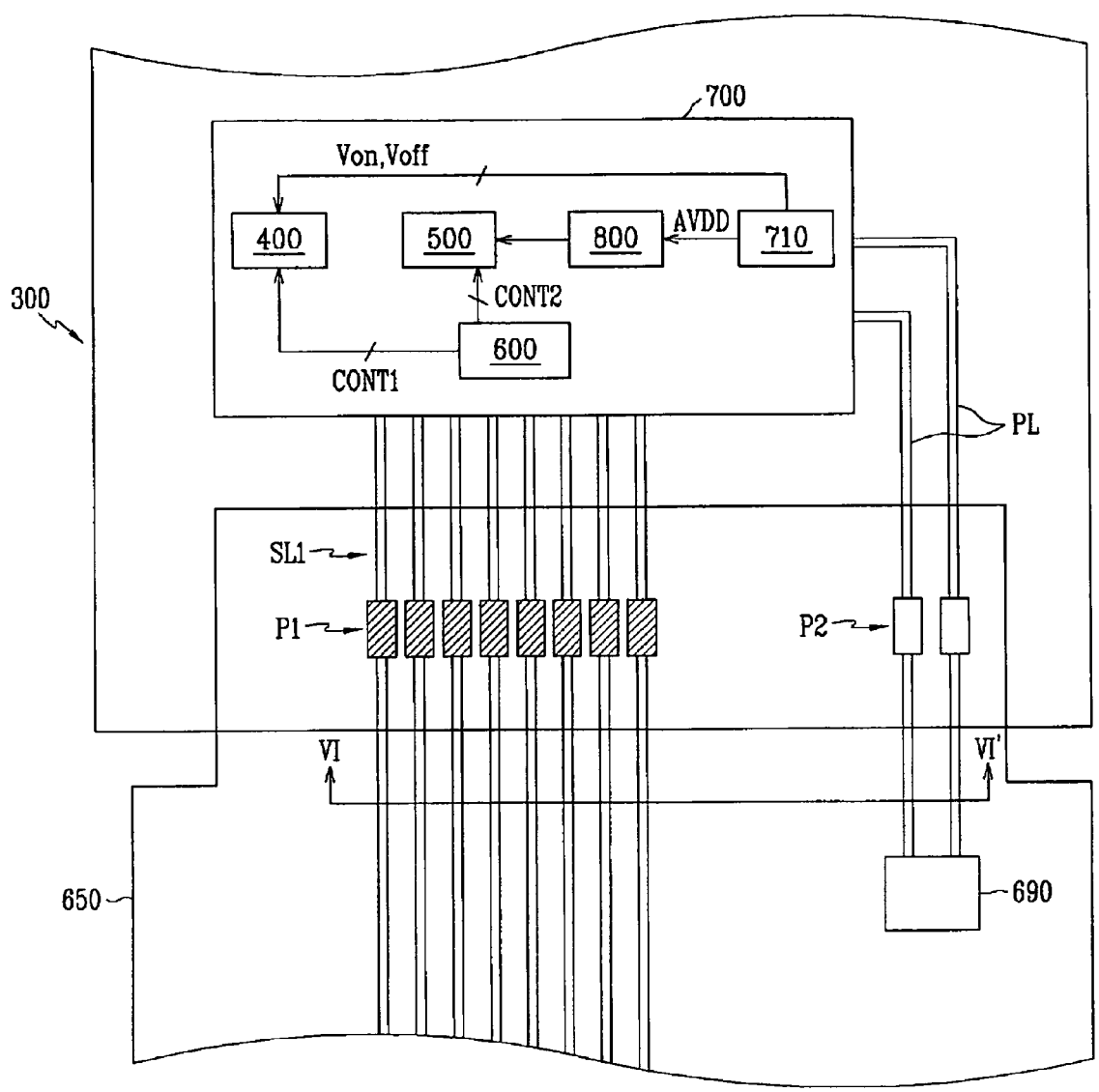
FIG. 5 is an enlarged perspective view illustrating a part of the liquid crystal display shown in FIG. 4.
Figure 6:
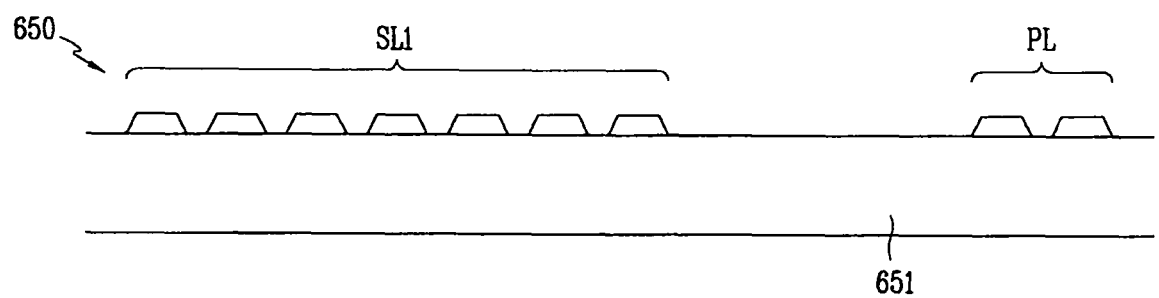
FIG. 6 is a cross-sectional view of an exemplary embodiment of a flexible printed circuit board taken along line VI-VI' in the liquid crystal display shown in FIG. 5.
Figure 7:
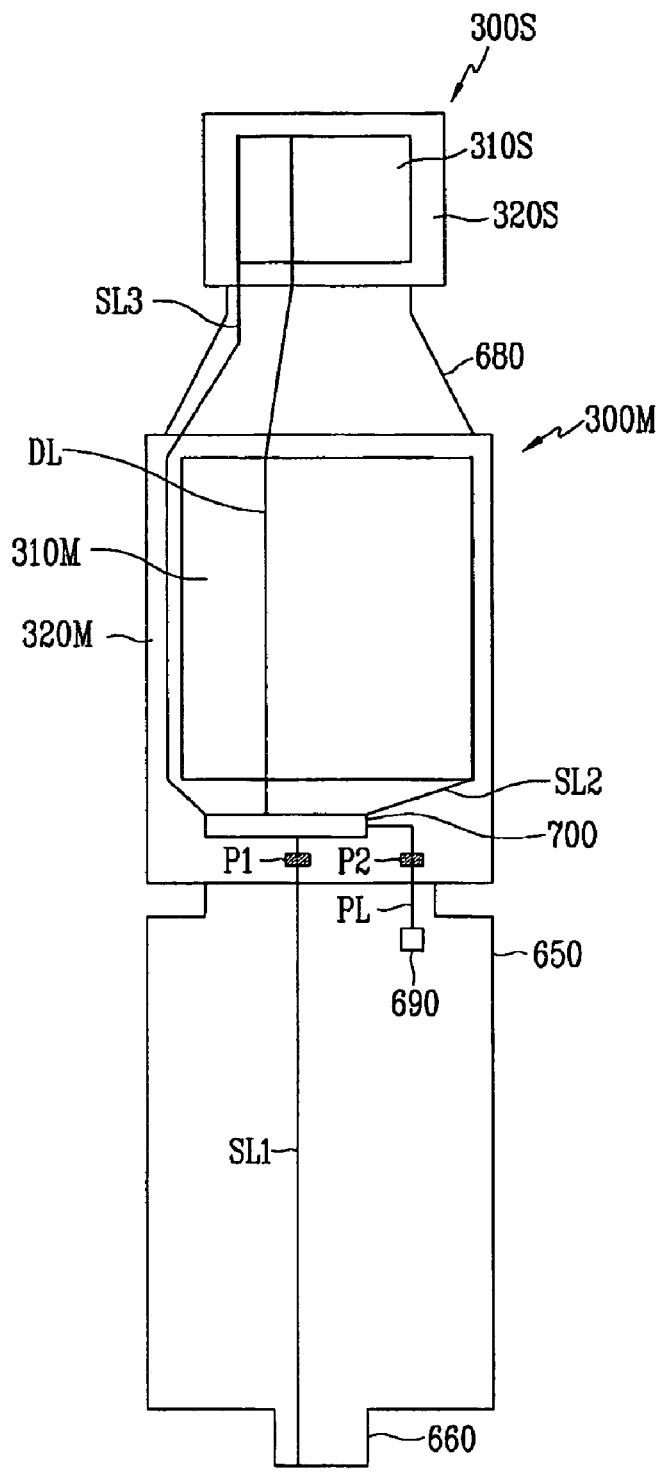
FIG. 7 is a schematic diagram illustrating an exemplary embodiment of a dual liquid crystal display according to the present invention.

FIG. 1 is an exploded perspective view illustrating an exemplary embodiment of a liquid crystal display according to the present invention, FIG. 2 is a block diagram illustrating an exemplary embodiment of a liquid crystal display according to the present invention, and FIG. 3 is an equivalent circuit diagram of an exemplary embodiment of a pixel in a liquid crystal display according to the present invention. FIG. 4 is a schematic diagram illustrating an exemplary embodiment of a liquid crystal display according to the present invention, FIG. 5 is an enlarged perspective view illustrating a part of the liquid crystal display shown in FIG. 4, and FIG. 6 is a cross-sectional view of an exemplary embodiment of a flexible printed circuit board taken along Line VI-VI' in the liquid crystal display shown in FIG. 5. FIG. 7 is a schematic diagram illustrating an exemplary embodiment of a dual liquid crystal display according to the present invention.

As shown in FIG. 1, an exemplary embodiment of the liquid crystal display according to the present invention includes a liquid crystal module 301 having a display panel 330 and a backlight unit 900, top and bottom chassis 361 and 362 for receiving the liquid crystal module 301, a mold frame 363, and a flexible printed circuit board (FPC) 650.

In an exemplary embodiment as illustrated in FIG. 1, the display device may be substantially frame shaped. For orientation purposes, a Cartesian coordinate system may be used where a first side of the display device extends along a Y-axis direction, and a second side of the display device extends along an X-axis direction, where the Y-axis is substantially perpendicular to the X-axis and a Z-axis direction is substantially perpendicular to both the X and Y axes.

The display panel 330 includes a liquid crystal panel assembly 300, an integration chip 700 mounted on the liquid crystal panel assembly 300, and a protective layer 701 formed to extend substantially around the integration chip 700.

The liquid crystal panel assembly 300 includes a bottom panel 100 and a top panel 200, and a liquid crystal layer 3 (FIG. 3) interposed therebetween.

As shown in FIG. 2, the liquid crystal panel assembly 300 includes a plurality of display signal lines having a plurality of gate lines $G_1$ to $G_n$ and a plurality of data lines $D_1$ to $D_m$, a plurality of pixels which are connected to the plurality of display signal lines and are arranged approximately in a matrix, and a gate driver 400 supplying signals to the gate lines $G_1$ to $G_n$. Most of the pixels and the display signal lines $G_1$ to $G_n$ and $D_1$ to $D_m$ are disposed in a display area 310 (FIG. 4).

The top panel 200 is relatively smaller in size than the bottom panel 100, and thus a part of the bottom panel 100 is exposed. A surface of the top panel 200 disposed opposite to and facing a surface of the bottom panel 100 includes a smaller area such that a portion of the surface of the bottom panel 100 is not faced by the top panel 200. The integration chip 700 is disposed on the exposed area of the bottom panel 100. The protective layer 701 is formed substantially on the bottom panel 100 in the exposed area and extending around the integration chip 700.

The display signal lines $G_1$ to $G_n$ and $D_1$ to $D_m$ include a plurality of gate lines $G_1$ to $G_n$ for delivering gate signals (also referred to as "scan signals") and a plurality of data lines $D_1$ to $D_m$ for delivering data signals. The gate lines $G_1$ to $G_n$ extend approximately in the row direction and are almost parallel to each other. The data lines $D_1$ to $D_m$ extend approximately in the column direction and are almost parallel to each other. The display signal lines $G_1$ to $G_n$ and $D_1$ to $D_m$ are widened to form pads (not shown) at positions where the display signal lines are connected to the FPC 650. The liquid crystal panel assembly 300 and the FPC 650 may be bonded to each other through an anisotropic conductive film (not shown) for electrical connection of the pads.

Each pixel includes a switching element Q connected to the corresponding display signal line $G_1$ to $G_n$ and $D_1$ to $D_m$, and a liquid crystal capacitor $C_{LC}$ and a storage capacitor $C_{ST}$ which are connected to the switching element Q. In exemplary embodiments, the storage capacitor $C_{ST}$ may be omitted.

The switching element Q, such as a thin film transistor, may be disposed on the bottom panel 100, and may be a three-terminal element having a control terminal connected to the corresponding gate line $G_1$ to $G_n$, an input terminal connected to the corresponding data line $D_1$ to $D_m$, and an output terminal connected to the liquid crystal capacitor $C_{LC}$ and the storage capacitor $C_{ST}$.

As shown in FIG. 3, the liquid crystal panel assembly 300 includes the bottom panel 100, the top panel 200, and the liquid crystal layer 3 interposed therebetween, and the display signal lines $G_1$ to $G_n$ and $D_1$ to $D_m$ and the switching elements Q are disposed on the bottom panel 100.

The liquid crystal capacitor $C_{LC}$ includes a pixel electrode 190 of the bottom panel 100 and a common electrode 270 of the top panel 200 as two terminals, and the liquid crystal layer 3 between the two electrodes 190 and 270 serves as a dielectric substance. The pixel electrode 190 is connected to the switching element Q, and the common electrode 270 is formed substantially on the entire surface of the top panel 200 and is supplied with a common voltage $V_{com}$ from the drive power generator 710. In alternative exemplary embodiments, the common electrode 270 may be formed on the bottom panel 100. In other exemplary embodiments, one or both of the electrodes 190 and 270 may be formed in a substantially line shape or a bar shape.

The storage capacitor $C_{ST}$ may be formed by allowing an additional signal line (not shown) formed on the bottom panel 100 and the pixel electrode 190 to overlap with each other. The additional signal line may be supplied with a predetermined voltage such as the common voltage $V_{com}$. In alternative exemplary embodiments, the storage capacitor $C_{ST}$ may be formed by allowing the pixel electrode 190 to overlap with a previous gate line directly on the pixel electrode with an insulation substance therebetween.

In order to embody color display, each pixel may display colors. The color display is possible by disposing a color filter 230 for one of three colors including, but not limited to, such colors as red, green, and blue in a region corresponding to the pixel electrode 190. The color filters 230 are formed on the top panel 200 in FIG. 3, but in alternative exemplary embodiments, the color filters 230 may be formed above or below the pixel electrodes 190 on the bottom panel 100.

In exemplary embodiments, a polarizing film (not shown) for polarizing light may be attached to the outer surface of at least one of two panels 100 and 200 of the liquid crystal panel assembly 300.

Referring again to FIG. 2, a drive power generator 710 generates power that is necessary for driving circuit elements, such as gate voltages $V_{on}$ and $V_{off}$, a reference voltage AVDD, and a common voltage $V_{com}$, and supplies the generated power.

The gate driver 400 is connected to the gate lines $G_1$ to $G_n$, is supplied with a gate-on voltage $V_{on}$ for turning on the switching elements Q and a gate-off voltage $V_{off}$ for turning off the switching elements Q from the drive power generator 710, and supplies a gate signal, which is obtained by combining the gate-on voltage $V_{on}$ and the gate-off voltage $V_{off}$ to the gate lines $G_1$ to $G_n$.

Referring to FIGS. 1-5, the integration chip 700 controls the liquid crystal panel assembly 300 by receiving external signals through a signal line SL1 disposed in a connection portion and the FPC 650 and supplying the processed signals to the liquid crystal panel assembly 300 through wires disposed in a peripheral area 320 of the liquid crystal panel assembly 300.

The integration chip 700 may include, as shown in FIG. 5, the drive power generator 710, the gate driver 400, a gray voltage generator 800, a data driver 500, and a signal controller 600. The drive power generator 710 may be disposed at one side of the integration chip 700 or may be disposed anywhere along the integration chip 700 as is suitable for the purpose described herein. For example, the drive power generator 710 is illustrated disposed at the right side of the integration chip 700 in FIG. 5. In exemplary embodiments, the integration chip may be disposed in the form of COG (Chip On Glass).

The FPC 650 may be attached substantially to one edge or towards one side of the liquid crystal panel assembly 300. A connection portion 660 for receiving external signals may be disposed at a portion of the FPC 650 away from the attachment area of the FPC 650 and the liquid crystal panel assembly 300. FIGS. 1 and 4 illustrate the connection portion 660 disposed opposite the attachment area of the FPC 650 and the liquid crystal panel assembly 300.

The FPC 650 includes a plurality of signal lines SL1 and SL2 for electrical connection between the connection portion 660 and the integration chip 700 and between the integration chip 700 and the liquid crystal panel assembly 300. The signal lines SL1 and SL2 are widened to form pads P1 at positions where the signal lines are connected to the integration chip 700 and at positions where the signal lines are connected to the liquid crystal panel assembly 300. In exemplary embodiments, the signal line SL1 may be connected to an external device (not shown) to deliver various signals to the integration chip 700.

The FPC 650 includes a passive element unit 690 which is connected to the drive power generator 710 positioned at one side of the integration chip 700 through a power supply line PL and a pad P2.

The passive element unit 690 may include a plurality of passive elements including, but not limited to, capacitors, inductors, and resistors which are required for generating drive power in the drive power generator 710. The power supply lines PL may be connected to the side surface of the integration chip 700 so as to prevent the power supply lines PL from intersecting the signal lines SL1.

Referring to FIG. 6, the FPC 650 includes an FPC substrate 651, and the signal line SL1 and the power supply line PL which extend substantially parallel to each other. The signal lines SL1 and the power supply lines PL are disposed on the top surface of the FPC substrate 651. The FPC 650 has a single-layered structure in which the signal lines SL1 and the power supply lines PL are disposed on only one surface. For example, signal lines SL1 and the power supply lines PL are disposed on the top surface of the FPC substrate 651 as shown in FIG. 6. In contrast, a double-layered structure may include the signal lines SL1 and the power supply lines PL disposed on the top surface and the bottom surface of the FPC substrate 651. Advantageously, it is possible to remarkably reduce the manufacturing cost for the display device including a single-layered FPC structure in comparison with an FPC employing the double-layered structure. It may also possible to improve noise and the delay of signals in the display device because the parasitic capacitance occurring due to intersection between wires in the double-layered structure is removed when the display device includes a single-layered FPC structure.

The liquid crystal panel assembly 300 includes a display area 310 constituting a screen and a peripheral area 320, as shown in FIG. 4. A light blocking layer (not shown), including, but not limited to, a black matrix, for blocking light may be disposed in the peripheral area 320. The FPC 650 is substantially attached to the peripheral area 320.

Referring again to FIGS. 2 and 5, the gray voltage generator 800 may receive a reference voltage AVDD from the drive power generator 710 and generates a set of gray scale voltages associated with brightness of pixels. In exemplary embodiments where two sets of gray scale voltages being generated by the gray voltage generator 800, one set thereof may have a positive value with respect to the common voltage $V_{com}$ and the other set may have a negative value with respect to the common voltage $V_{com}$.

The data driver 500 is connected to the data lines $D_1$ to $D_m$ of the liquid crystal panel assembly 300, and selects and supplies the gray scale voltages from the gray voltage generator 800 as data signals to the pixels.

The signal controller 600 is connected to the backlight unit 900 and serves to control operations of the gate driver 400 and the data driver 500.

As shown in FIGS. 1 and 2, the backlight unit 900 is fixed to an edge in the minor axis of the mold frame 363, and includes a lamp LP for irradiating light to the liquid crystal panel assembly 300, a circuit element (not shown) for controlling the lamp, a printed circuit board 670 with the lamp LP mounted thereon, a light guide film 902 for guiding the light from the lamp LP to the liquid crystal panel assembly 300 and making the intensity of light constant, a reflecting sheet 903 disposed below the light guide film 902 so as to reflect the light from the lamp LP to the liquid crystal panel assembly 300, and a plurality of optical sheets 901 disposed above the light guide film 902 so as to secure the brightness characteristic of the light from the lamp LP.

The top chassis 361 and the bottom chassis 362 are respectively coupled to top and bottom portions of the mold frame 363, and receive the liquid crystal module 301 to constitute a liquid crystal display.

FIG. 7 is a diagram illustrating an exemplary embodiment of a dual liquid crystal display according to the present invention.

As shown in FIG. 7, the dual liquid crystal display according to the present invention includes a main liquid crystal panel assembly 300M, an FPC 650, an auxiliary FPC 680 and a subsidiary liquid crystal panel assembly 300S. The auxiliary FPC 680 is connected at an end of the main liquid crystal panel assembly 300M opposite to that of the FPC 650. The auxiliary FPC 680 may be connected to the top and bottom portions, for example, the top and bottom panel 100 and 200, of the main liquid crystal panel assembly 300M.

The main and subsidiary liquid crystal panel assemblies 300M and 300S include display areas 310M and 310S and peripheral areas 320M and 320S, respectively.

Since the structure of the main and subsidiary liquid crystal panel assembly 300M and 300S is substantially the same as that of the liquid crystal panel assembly 300 described above, a detailed description thereof will be omitted.

The subsidiary liquid crystal panel assembly 300S is supplied with gate signals and data signals through the signal lines SL3 and the data lines DL connected to the integration chip 700. In alternative exemplary embodiments, an additional chip (not shown) for driving the subsidiary liquid crystal panel assembly 300S may be provided. However, in this case, the FPC 650 may have a single-layered structure.

Now, operations of the liquid crystal display will be described in detail.

Referring to FIGS. 2 and 5, the signal controller 600 of the integration chip 700 is supplied with input image signals R, G, and B, and input control signals for controlling display of the input image signals R, G, and B, including, but not limited to, a vertical synchronization signal $V_{sync}$, a horizontal synchronization signal $H_{sync}$, a main clock signal MCLK, and a data enable signal DE, from an external graphics controller (not shown). The signal controller 600 generates a gate control signal CONT1 and a data control signal CONT2 on the basis of the input image signals R, G, and B and the input control signals, appropriately processes the input image signals R, G, and B in accordance with operational conditions of the liquid crystal panel assembly 300, supplies the gate control signal CONT1 to the gate driver 400, and supplies the data control signal CONT2 and the processed image signals DAT to the data driver 500.

The gate control signal CONT1 may include a scanning start signal STV for indicating the start of output of the gate-on voltage $V_{on}$, a gate clock signal CPV for controlling the time of output of the gate-on voltage $V_{on}$, and an output enable signal OE for defining the retaining time of the gate-on signal $V_{on}$.

The data control signal CONT2 may include a horizontal synchronization start signal STH for indicating the start of input of the image data DAT, a load signal LOAD for instructing to apply the corresponding data voltages to the data lines $D_1$ to $D_m$, an inversion signal RVS for instructing to invert the polarity of the data voltage with respect to the common voltage $V_{com}$ (hereinafter, "polarity of the data voltage with respect to the common voltage" is referred to as "polarity of the data voltage"), and a data clock signal HCLK.

In response to the data control signal CONT2 from the signal controller 600, the data driver 500 sequentially receives the image data DAT corresponding to the pixels in a row, converts the image data DAT into data voltages by selecting the gray scale voltages corresponding to the image data DAT among the gray scale voltages from the gray voltage generator 800, and supplies the data voltages to the corresponding data lines $D_1$ to $D_m$.

In response to the gate control signal CONT1 from the signal controller 600, the gate driver 400 sequentially supplies the gate-on voltage $V_{on}$ to the gate lines $G_1$ to $G_n$ to turn on the switching elements Q connected to the gate lines $G_1$ to $G_n$. Accordingly, the data voltages supplied to the data lines $D_1$ to $D_m$ are applied to the corresponding pixels through the turned-on switching elements Q.

The difference between the data voltage applied to a pixel and the common voltage $V_{com}$ appears as a charged voltage of the liquid crystal capacitor $C_{LC}$, that is, a pixel voltage. Liquid crystal molecules vary in alignment depending upon the magnitude of the pixel voltage. Accordingly, the light passing through the liquid crystal layer 3 varies in polarization. The variation in polarization appears as variation in light transmissivity by means of the polarizing film (not shown) attached to the panels 100 and 200.

When one horizontal period (or "1H") (which is one period of the horizontal synchronization signal $H_{sync}$, the data enable signal DE, and the gate clock CPV) has passed, the data driver 500 and the gate driver 400 repeat the same operations for the pixels in the next row. In this way, the gate-on voltage $V_{on}$ is sequentially applied to all the gate lines $G_1$ to $G_n$ for one frame, thereby applying the data voltage to all the pixels. The next frame is started after one frame is ended, and the status of the inversion signal RVS supplied to the data driver 500 is controlled so that the polarities of the data voltages applied to the respective pixels are inverted every predetermined frame ("frame inversion"). At this time, in one frame, the polarity of the data voltage supplied through one data line may be inverted (for example, "column inversion", "dot inversion") or the polarities of the data voltages supplied to the pixels in one row may be opposite to each other (for example, "row inversion", "dot inversion"), depending upon the characteristic of the inversion signal RVS.

On the other hand, although the liquid crystal display has been exemplified in the embodiments of the present invention, it is obvious that the present invention may apply to display devices such as an organic light emitting display (OLED) and a plasma display panel (PDP).

In an exemplary embodiment, by disposing the drive power generator 710 at substantially one side of the integration chip 700 such that the power supply lines PL and the signal lines SL1 connected to the drive power generator 710 do not intersect each other, the FPC 650 can be embodied in the single-layered structure. Advantageously, it is possible to remarkably reduce the manufacturing cost in comparison with a double-sided structure. In addition, the parasitic capacitance which may occur in the two-layered structure may be removed, thereby preventing noise and the delay of signals.

Although the exemplary embodiments of the present invention have been described in detail, the present invention is not limited to the embodiments, but may be modified in various forms without departing from the scope of the appended claims. Therefore, it is natural that such modifications belong to the scope of the present invention.

What is claimed is:

1. A display device comprising:
   a display panel unit;
   a circuit board attached substantially to one side of the display panel unit;
   a first wire and a second wire disposed on one surface of the circuit board,
   a drive circuit chip for driving the display panel unit disposed on the display panel unit where the circuit board is not disposed,
   a drive power generator generating a drive voltage provided in the drive circuit chip;
   a passive element unit provided on the circuit board, the passive element unit being connected to the first wire;
   wherein
   the first wire and the second wire are both directly connected to the drive circuit chip, and, the second wire is connected to an external device disposed outside of the circuit board,
   the second wire does not intersect the first wire,
   the second wire is a signal line for delivering a signal to the drive circuit chip from the external device,
   the first wire and the second wire are connected to the drive circuit chip through pad portions disposed on the display panel unit, respectively, the pad portions being spaced apart from the drive circuit chip, and
   the first wire is connected to a first side surface of the drive circuit chip, and the second wire is connected to a second side surface of the drive circuit chip, the second side surface extending in a different direction from the first side surface.

2. The circuit board of claim 1, wherein the first wire is a power supply line.

3. The display device of claim 1, further comprising:
   a plurality of pixels each of which includes a switching element;
   a gate driver for supplying a gate signal to the pixels;
   a data driver for supplying a data voltage to the pixels; and
   a gray voltage generator for generating a plurality of gray scale voltages;
   wherein the drive power generator generates the gate signal, a common voltage, and a reference voltage.

4. The display device of claim 3, wherein the gate driver, the data driver, and the gray voltage generator are provided on the drive circuit chip.

5. The display device of claim 4, wherein the drive power generator is disposed substantially in a side of the drive circuit chip.

6. The display device of claim 1, wherein the first wire is connected to the drive power generator.

7. The display device of claim 1, wherein the display panel unit comprises a first panel, a second panel and a liquid crystal layer interposed therebetween,
   wherein the drive circuit chip is attached to the first panel.

8. The display device of claim 7, wherein a portion of the first panel is exposed from the second panel, and
   wherein the drive circuit chip is attached to the exposed portion of the first panel.

9. The display device of claim 7, further comprising an auxiliary circuit board connecting the first panel to the second panel.

10. The display device of claim 9, wherein the auxiliary circuit board is disposed at an end of the display panel unit opposite to that of the circuit board.

11. The display device of claim 9, wherein the drive circuit chip is disposed in the form of COG (Chip On Glass).

12. The display device of claim 1, wherein the circuit board is a flexible printed circuit board.

* * * * *